US006809969B2

(12) United States Patent
Ohtani et al.

(10) Patent No.: US 6,809,969 B2
(45) Date of Patent: Oct. 26, 2004

(54) NON-VOLATILE SEMICONDUCTOR MEMORY DEVICE CAPABLE OF RAPID OPERATION

(75) Inventors: Jun Ohtani, Hyogo (JP); Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 14 days.

(21) Appl. No.: 10/404,137

(22) Filed: Apr. 2, 2003

(65) Prior Publication Data

US 2004/0076038 A1 Apr. 22, 2004

(30) Foreign Application Priority Data

Oct. 21, 2002 (JP) ....................................... 2002-306104

(51) Int. Cl.[7] ................................................ G11C 16/06

(52) U.S. Cl. ............................ 365/185.29; 365/185.22; 365/218

(58) Field of Search ....................... 365/185.29, 185.22, 365/185.18, 185.05, 185.33, 185.25, 218

(56) References Cited

U.S. PATENT DOCUMENTS

| | | | | |
|---|---|---|---|---|
| 5,293,337 A | * | 3/1994 | Aritome et al. | 365/185.17 |
| 5,812,457 A | * | 9/1998 | Arase | 365/185.22 |
| 5,949,714 A | * | 9/1999 | Hemink et al. | 365/185.17 |
| 6,061,270 A | * | 5/2000 | Choi | 365/185.02 |
| 6,081,456 A | | 6/2000 | Dadashev | |
| 6,188,611 B1 | * | 2/2001 | Endoh et al. | 365/185.24 |

FOREIGN PATENT DOCUMENTS

| | | |
|---|---|---|
| JP | 6-275087 | 9/1994 |
| JP | 7-272491 | 10/1995 |
| JP | 9-82921 | 3/1997 |

* cited by examiner

*Primary Examiner*—Richard Elms
*Assistant Examiner*—Dang Nguyen
(74) *Attorney, Agent, or Firm*—Burns, Doane, Swecker & Mathis, L.L.P.

(57) ABSTRACT

At a time a voltage of 6V is applied to all word lines and memory cells connected to a bit line are all simultaneously subjected to a weak write operation using a channel hot electron. Furthermore at a subsequent time a voltage of approximately 2V is applied to a word line and any single memory cell connected to the word line is subjected to a verify operation. The series of the weak write and verify operations are repeated until this memory cell's threshold voltage attains 2V corresponding to an erased condition.

5 Claims, 8 Drawing Sheets

1000
MBL1
SG2
SG1
10
20
MBL3
SG6
SG5
50
60
BL2
BL4
BL6
BL8
WL1
101 102 103 104 105 106 107 108 109 110 111 112 113 114
WL2
201 202 203 204 205 206 207 208 209 210 211 212 213 214
WLn
n01 n02 n03 n04 n05 n06 n07 n08 n09 n10 n11 n12 n13 n14
BL1
BL3
BL5
BL7
30
40
70
80
SG3
SG4
MBL2
SG7
SG8
MBL4

1000
MBL1
SG2
SG1
WL1
WL2
WLn
BL1
BL2
BL3
BL4
BL5
BL6
BL7
BL8
MBL2
SG3
SG4
MBL3
SG6
SG5
SG7
SG8
MBL4
10
20
30
40
50
60
70
80

1000
MBL1
SG2
SG1
WL1
WL2
WLn
10
20
30
40
50
60
70
80
BL1
BL2
BL3
BL4
BL5
BL6
BL7
BL8
SG3
SG4
MBL2
MBL3
SG6
SG5
SG7
SG8
MBL4
101
102
103
104
105
106
107
108
109
110
111
112
113
114
201
202
203
204
205
206
207
208
209
210
211
212
213
214
n01
n02
n03
n04
n05
n06
n07
n08
n09
n10
n11
n12
n13
n14

NON-VOLATILE SEMICONDUCTOR MEMORY DEVICE CAPABLE OF RAPID OPERATION

BACKGROUND OF THE INVENTION

1. Field of the Invention

The present invention relates generally to non-volatile semiconductor memory devices and particularly to those having a metal oxide nitride oxide silicon (MONOS) configuration.

2. Description of the Background Art

Conventional non-volatile semiconductor memory devices, flash electrically-erasable programmable read-only memories (EEPROMs) capable of electrically writing information to be stored and electrically erasing information stored therein in particular, perform an erase operation for one memory cell region (or block) of a range at a time and a verify operation for one memory cell at a time.

Such a conventional non-volatile semiconductor memory device has been improved, as proposed as follows:

Japanese Patent Laying-Open No. 6-275087 proposes a technique allowing memory cell transistors having "0" and "1" written therein, respectively, before over-erasure to have their respective threshold values with a reduced variation therebetween after over-erasure.

Furthermore, Japanese Patent Laying-Open No. 7-272491 proposes that a plurality of memory cells are erased to have an overerased condition and only while a cell/cells leaks/leak a current due to the overerased condition the cell/cells is/are subjected to a write to allow all memory cells to have their threshold values matched to have a prescribed value when they have an erased condition.

As has been described above, conventional non-volatile semiconductor memory devices, flash EEPROMs in particular, perform an erase operation for one memory cell region (or block) of a range at a time and perform a verify operation for one memory cell at a time. As such, the verify operation is disadvantageously more time consuming than the erase operation.

The above disadvantage of conventional non-volatile semiconductor memory devices is resolved by a technique such as disclosed in Japanese Patent Laying-Open No. 6-275087. The technique disclosed in this publication, however, would not permit a simultaneous write operation following overerasure to sufficiently correct a variation in threshold value between memory cell transistors.

Japanese Patent Laying-Open No. 7-272491, proposing that only while a cell/cells overerased leaks/leak a current the cell/cells is/are subjected to a write to allow all memory cells to have their threshold values matched to have a prescribed value when they have an erased condition, does not have any relationship with the issue of the reduction of the verify time.

SUMMARY OF THE INVENTION

The present invention contemplates a non-volatile semiconductor memory device that corrects a variation in threshold value between memory cell transistors in a simultaneous write operation following overerasure and also provides a verify operation in a reduced period of time.

In accordance with the present invention a non-volatile semiconductor memory device includes: first, second and third bit lines arranged to extend in a direction of a column;

a plurality of memory cells configuring first and second memory cell columns adjacent to each other, each memory cell being configured of a transistor having an electric charge trapping film; and a plurality of word lines provided to correspond respectively to rows of the plurality of memory cells. The first memory cell column is connected between the first bit line and the second bit line and the second memory cell column is connected between the second bit line and the third bit line. The non-volatile semiconductor memory device further includes: an erase control portion controlling an erase operation effected for the plurality of memory cells; and a weak write control portion controlling a weak write operation effected for the plurality of memory cells, and the erase control portion subjects all of the plurality of memory cells simultaneously to an erase operation allowing a memory cell to transition to an overerased condition and the weak write control portion subjects all of the plurality of memory cells simultaneously to a weak write operation using a channel hot electron.

Thus in accordance with the present invention a weak write using a channel hot electron can be used to correct a variation in threshold value between memory cell transistors in a simultaneous write operation following overerasure and also allow a verify operation to be performed in a reduced period of time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
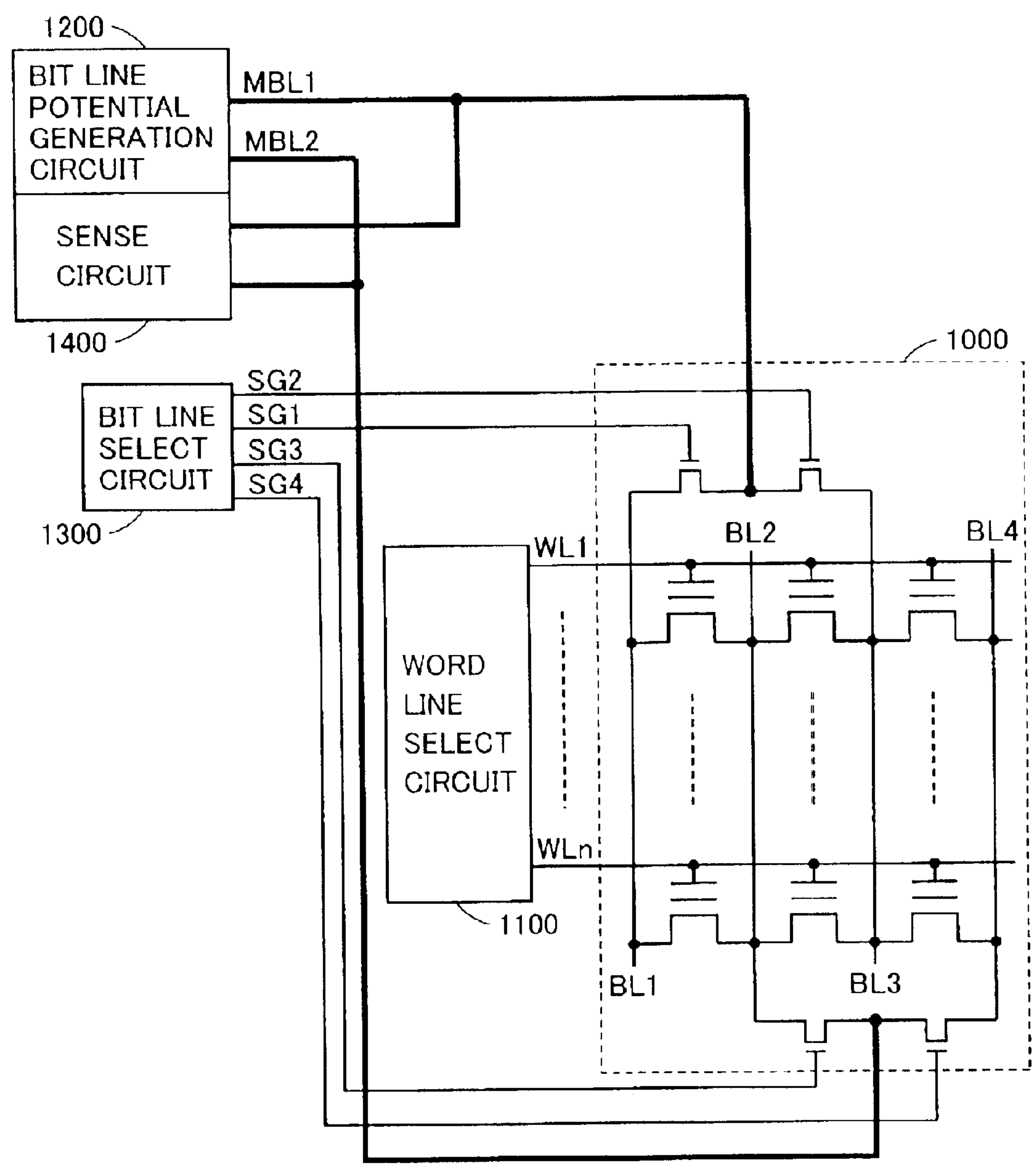
FIG. 1 is a block diagram showing a configuration of a characteristic portion of an NROM of the present invention having a virtually grounded memory cell array.

Hereinafter the present invention in embodiments will more specifically be described with reference to the drawings. In the figures, identical or like components are denoted by identical reference characters and their description will not be repeated.

Non-volatile semiconductor memory devices that are electrically rewritable and erasable are referred to as EEPROMs, as has been mentioned previously. For the EEPROM a memory cell transistor typically has one end connected to a source line coupled with a ground potential. However, the source line needs to be arranged between bit lines at prescribed intervals, which is an obstacle to high integration. Accordingly in recent years a virtually grounded memory cell array has been considered. A virtually grounded memory cell array is disclosed for example in Japanese Patent Laying-Open No. 9-82921.

Of EEPROMs, one type of flash EEPROM has been noted. It is nitride read only memory (NROM) flash EEPROM (hereinafter referred to as an "NROM"). It is a non-volatile semiconductor memory device having an MONOS configuration with an oxide nitride oxide (ONO) film as a gate insulation film. The NROM allows a single memory cell to store two bits of information. As such it can be expected to permit a smaller chip area for one bit than other types of non-volatile semiconductor memory device having a floating gate. An NROM is disclosed for example in U.S. Pat. No. 6,081,456.

FIG. 1 is a block diagram showing a configuration of a characteristic portion of an NROM of the present invention having a virtually grounded memory cell array.

As shown in FIG. 1, the present NROM includes a memory cell array 1000, a word line select circuit 1100, a bit line potential generation circuit 1200, a bit line select circuit 1300, and a sense circuit 1400.

Memory cell array 1000 includes a plurality of memory cell transistors (hereinafter simply referred to as a memory cell or a cell) arranged in rows and columns, word lines WL1–WLn each provided to correspond to a row, and bit lines BL1–BL4 each provided to correspond to a column.

Note that the circuit configuration of memory cell array 1000 shown in FIG. 1 is an exemplary circuit configuration shown to help to understand other components shown in FIG. 1 such as word line select circuit 1100, and the circuit configuration of memory cell array 1000 of the present invention is not limited thereto. Circuit configurations of memory cell array 1000 that correspond to embodiments of the present invention will be described with reference to FIGS. 2, 8 and 9.

Word line select circuit 1100 selects word lines WL1–WLn and enables a selected row. Bit line potential generation circuit 1200 supplies main bit lines MBL1, MBL2 with a prescribed voltage. Bit line select circuit 1300 controls a connection between bit lines BL1–BL4 and main bit lines MBL1, MBL2 via select gate lines SG1–SG4. Sense circuit 1400 senses via main bit lines MBL1, MBL2 a current flowing through a memory cell.

First Embodiment

Figure 2:
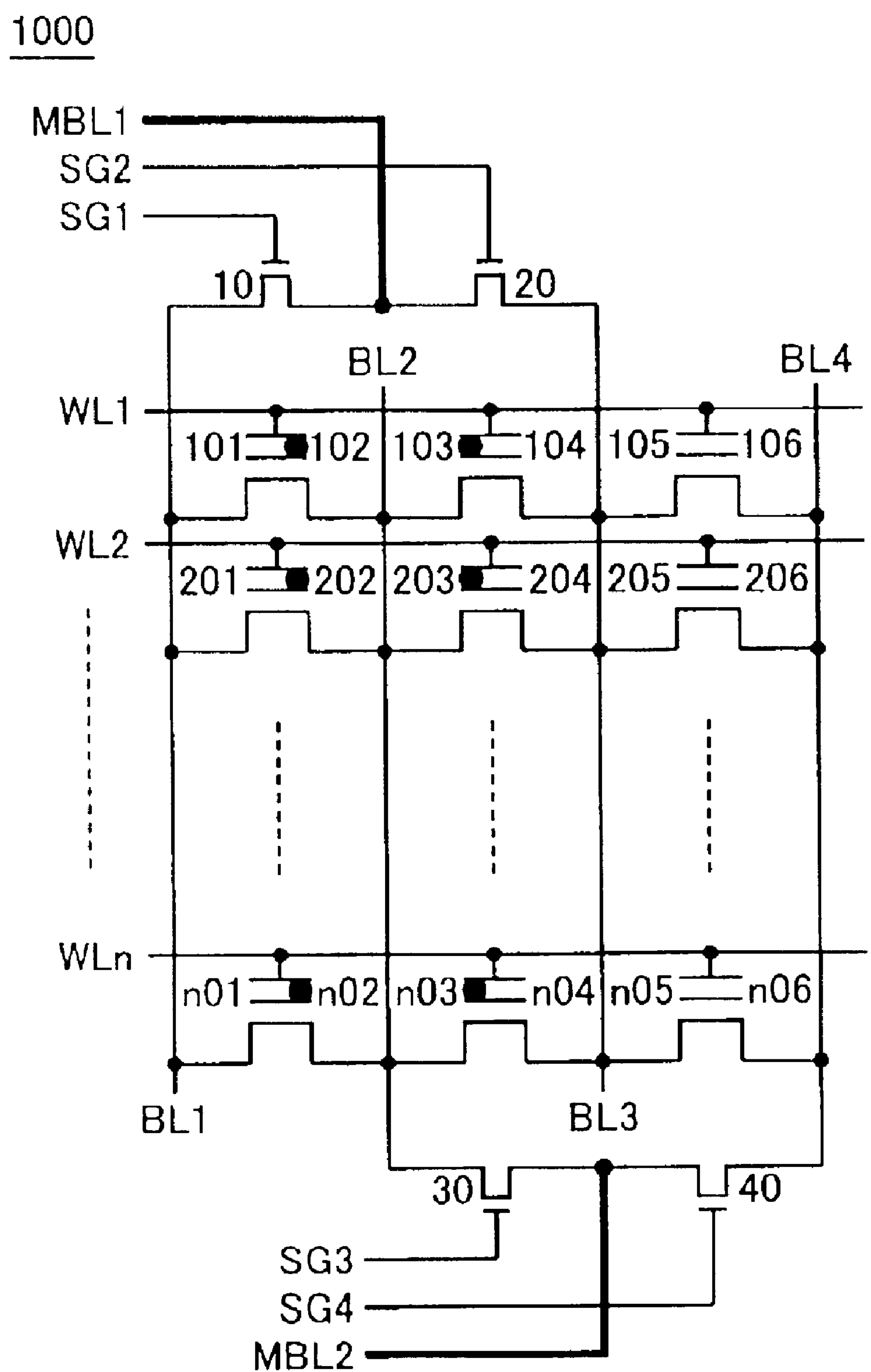
FIG. 2 is a circuit diagram showing a circuit configuration of a memory cell array 1000 of the present invention in a first embodiment.

FIG. 2 is a circuit diagram showing a circuit configuration of memory cell array 1000 of the present invention in a first embodiment. As has been described previously, an NROM allows a single memory cell to store two bits of information. Accordingly hereinafter a memory cell will be distinguished bit by bit whenever it is referred to.

As shown in FIG. 2, memory cell array 1000 of the first embodiment includes memory cells k01–k06 connected to word line WLk, and select gates 10–40 connecting/disconnecting a main bit line and a bit line in accordance with a voltage applied to select gate lines SG1–SG4, wherein k=1 to n . . . .

Memory cell k01 is connected to bit line BL1. Memory cells k02, k03 are both connected to and share bit line BL2. Memory cells k04, k05 are both connected to and share bit line BL3. Memory cell k06 is connected to bit line BL4.

Select gate 10 connects/disconnects main bit line MBL1 and bit line BL1 in accordance with a voltage applied to select gate line SG1. Select gate 20 connects/disconnects main bit line MBL1 and bit line BL3 in accordance with a voltage applied to select gate line SG2. Select gate 30 connect/disconnects main bit line MBL2 and bit line BL2 in accordance with a voltage applied to select gate line SG3. Select gate 40 connects/disconnects main bit line MBL2 and bit line BL4 in accordance with a voltage applied to select gate line SG4.

Figure 3:
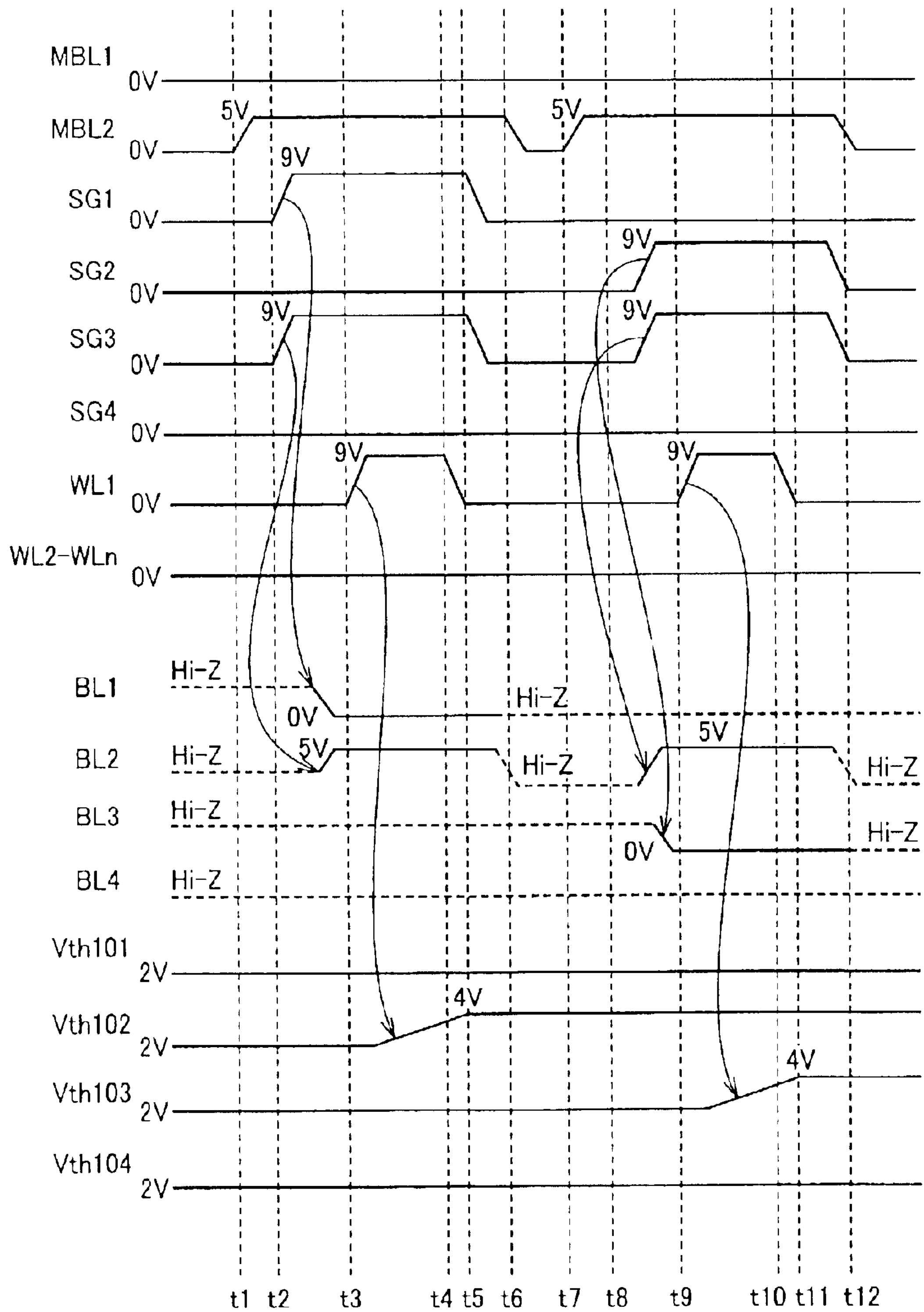
FIG. 3 is timing plots for illustrating a write operation in memory cell array 1000 in the first embodiment.

In FIG. 2 dots in memory cells indicate that memory cells k02 and k03 connected to bit line BL2 has been subjected to a write. Reference will now be made to FIG. 3 to more specifically describe an operation writing to memory cells 102 and 103 of memory cells k02 and k03.

FIG. 3 is timing plots for representing a write operation in memory cell array 1000 of the first embodiment.

FIG. 3 represents an operation writing at times T1–T6 to cell 102 and similarly writing at times T7–T12 to cell 103. Note that memory cell transistors 101–104 have their threshold voltages Vth101–Vth104 of 2V (an erased condition) at time T1 or in an initial state for the sake of illustration.

Initially at time T1 a write voltage 5V is applied to main bit line MBL2. Note that main bit line MBL1 continues to have 0V.

At time T2 a voltage of 9V is applied to select gate lines SG1, SG3. Thus via select gates 10, 30 main bit lines MBL1, MBL2 and bit lines BL1, BL2 are connected together, respectively. As a result, bit lines BL1 and BL2 transition to 0V and 5V, respectively. Note that bit lines BL3, BL4 both continue to have a high impedance state (Hi-Z).

At time t3 a voltage of 9V is applied to word line WL1 to start an operation writing to memory cell 102. By applying the voltage of 9V to word line WL1 a current flows through a channel of memory cell transistor 101 (102) from bit line BL2 toward bit line BL1 and a channel hot electron (hereinafter referred to as a "CHE") is generated in memory cell transistor 101 (102). As a result, an electron is trapped in an ONO film existing in a vicinity closer to the drain of memory cell transistor 101 (102) (i.e., BL2) and memory cell 102 is subjected to a write. This is based on the NROM's operation principle. As memory cell 102 has been subjected to a write, memory cell 102 has its threshold voltage Vth102 increasing from 0V.

At time t4 word line WL1 is set to recover an inactive state of 0V.

At time t5 select gate lines SG1, SG3 are set to recover an inactive state of 0V.

At time t6 main bit line MBL2 is set to recover an inactive state of 0V and the operation writing to memory cell 102 is completed. Memory cell 102 currently has threshold voltage Vth102 increased to approximately 4V.

From time t7 through time t12 memory cell 103 is subjected to a write operation similarly as memory cell 102 has.

The above write operations allow threshold voltages Vth102 and Vth103 to increase to approximately 4V and memory cells 102, 103 to both transition to written condition, and repeating such write operation allows memory cells k02 and k03 connected to bit line BL2 to all have a written condition, as shown in FIG. 2.

Figure 4:
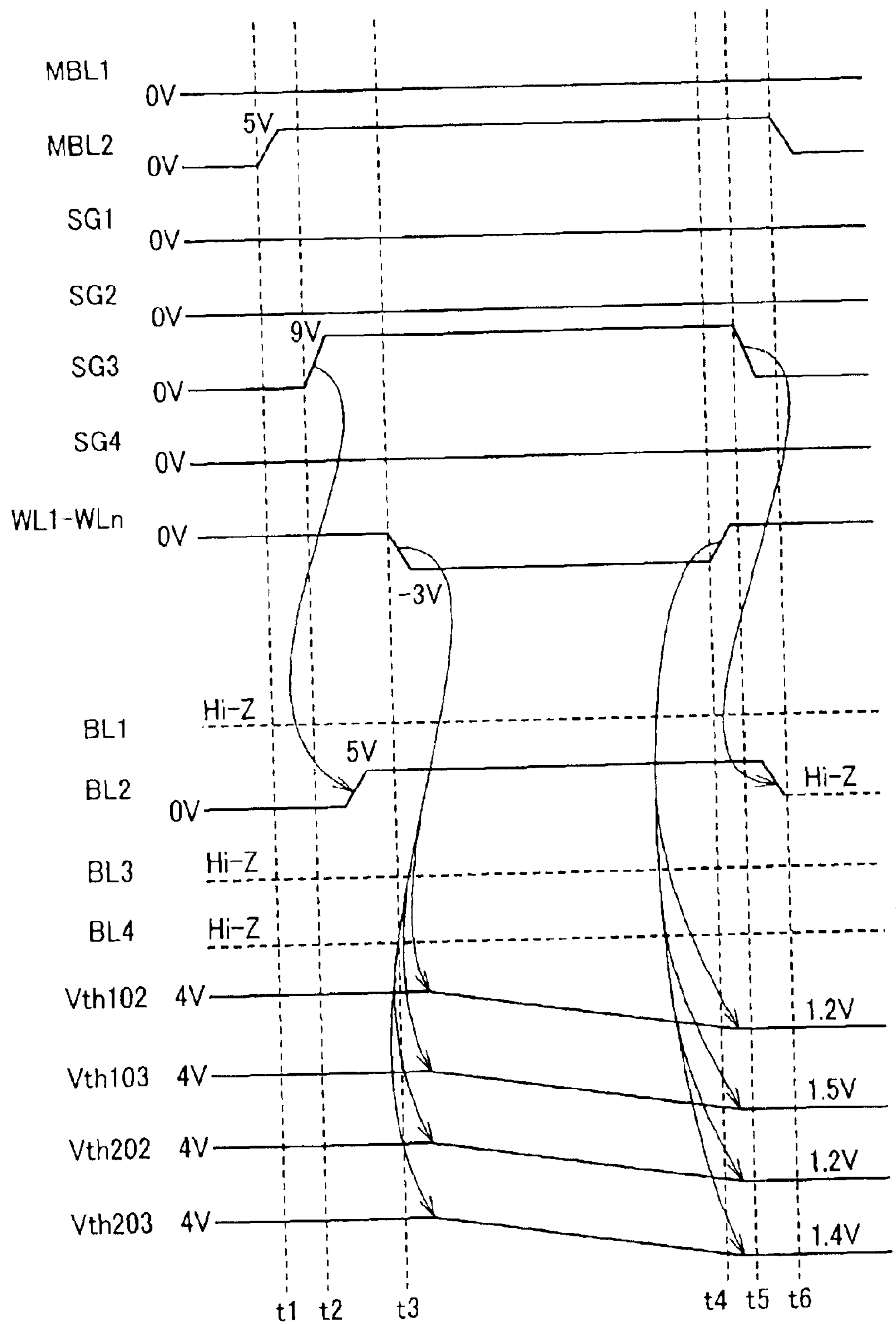
FIG. 4 is timing plots for illustrating an erase operation in memory cell array 1000 in the first embodiment.

FIG. 4 is timing plots for representing an erase operation in memory cell array 1000 of the first embodiment.

FIG. 4 represents an operation collectively erasing a written conduction of memory cells k02 and k03 connected to bit line BL2. Memory cell transistors k02 and k03 have their threshold voltages of 4V (the written condition) at time t1 or in an initial state. FIG. 4 representatively indicates threshold voltages Vth102, Vth103, Vth202, Vth203 of memory cell transistors 102, 103, 202, 203.

Initially at time t1 an erase voltage of 5V is applied to main bit line MBL2. Note that main bit line MBL1 continues to have 0V.

At time t2 a voltage of 9V is applied to select gate line SG3. Thus via select gate 30 main bit line MBL2 and bit line BL2 are connected together. As a result, bit line BL2 transitions to 5V. Note that bit lines BL1, BL3, BL4 all continue to have a high impedance state (Hi-Z).

At time t3 a voltage of −3V is applied to all of word lines WL1–WLn and memory cells k02 and k03 are all simultaneously subjected to an erase operation. Rather than any one of the word lines, word lines WL1–WLn all receive the voltage of −3V applied to allow memory cells k02 and k03 to be all simultaneously subjected to an erase operation. This is one of features of the present invention.

The application of the voltage of −3V to all word lines WL1–WLn introduces band to band transfer (BTBT) in all of memory cells k02 and k03. Consequently, a hole generated from a vicinity closer to a drain of a memory cell transistor (i.e., BL2) is trapped in an ONO film at a portion storing an electron. The electron and the hole electrically neutralize and memory cells k02 and k03 are all subjected to an erase operation.

As memory cells k02 and k03 have all been subjected to an erase operation, memory cell transistors k02 and k03 have their threshold voltages all decreasing from 4V. As shown in FIG. 4, threshold voltages Vth102, Vth103, Vth202, Vth203 all drop from 4V.

At time t4 word lines WL1–WLn are all set to recover an inactive state of 0V.

At time t5 select gate line SG3 is set to recover an inactive state of 0V.

At time t6 main bit line MBL2 is set to recover an inactive state of 0V and an erase operation for all of memory cells k02 and k03 is completed. Memory cells k02 and k03 currently all have an overerased condition with a threshold voltage lower than 2V corresponding to a prescribed erased condition. Furthermore, their respective threshold voltages vary from memory cell to memory cell.

To resolve this variation in threshold voltage and shift all of memory cells k02 and k03 from an overerased condition to a prescribed erased condition a weak write and verify operation is performed, as will be described hereinafter.

Figure 5:
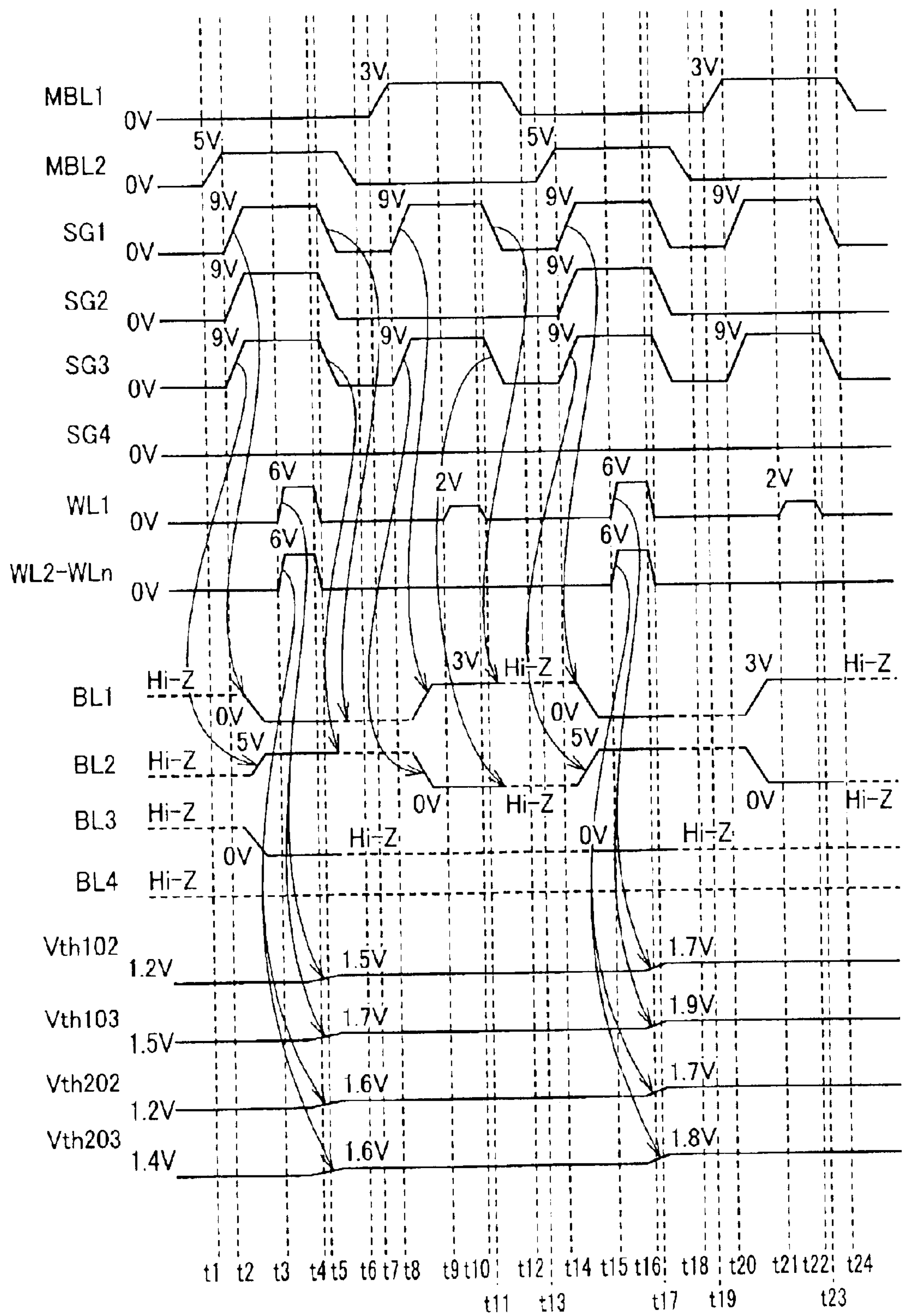
FIG. 5 is timing plots for illustrating a weak write and verify operation in memory cell array 1000 in the first embodiment.

FIG. 5 is timing plots for illustrating a weak write and verify operation in memory cell array 1000 of the first embodiment.

FIG. 5 represents an operation providing a first weak write and verification from times t1 through t12 and a second weak write and verification from times t13 through time t24. The weak write operation is performed for all of memory cells k02 and k03 and the verify operation for any one memory cell.

Memory cell transistors k02 and k03 have their threshold voltages varying from memory cell to memory cell at time t1 or in an initial state, as has been described previously. As well as FIG. 4, FIG. 5 also representatively indicates threshold voltages Vth102, Vth103, Vth202, Vth203.

Initially at time t1 a write voltage 5V is applied to main bit line MBL2. Note that main bit line MBL1 continues to have 0V.

At time T2 a voltage of 9V is applied to select gate lines SG1, SG2, SG3. Thus via select gates 10, 20 main bit line MBL1 and bit lines BL1, BL3 are connected together and via select gate 30 main bit line MBL2 and bit line BL2 are connected together. As a result, bit lines BL1, BL3 transitions to 0V and bit line BL2 to 5V. Note that bit line BL4 continues to have a high impedance state (Hi-Z).

At time t3 a voltage of 6V is applied to all of word lines WL1–WLn and memory cells k02 and k03 are all simultaneously subjected to a weak write operation corresponding to a stage preceding a verify operation.

For a typical write operation, a high voltage of 9V is applied, as has been described with reference to FIG. 3. For the weak write operation serving as a stage preceding a verify operation, a voltage necessary for slightly increasing a threshold voltage, i.e., 6V is applied, since an ONO film is only required to trap a small number of electrons. Note that the number of electrons trapped by the ONO film can also be reduced to a small number by controlling a write time.

Thus, rather than any single word line, word lines WL1–WLn all receive the voltage of 6V applied thereto and memory cells k02 and k03 are all simultaneously subjected to a weak write operation corresponding to a stage preceding a verify operation. This is one of features of the present invention.

The application of the voltage of 6V to all of word lines WL1–WLn allows a current to flow through the channels of memory cell transistors k02 and k03 from bit line BL2 toward both bit lines BL1 and BL3 and generates a channel hot electron in memory cell transistors k02 and k03. As a result, a small number of electrons are trapped in an ONO film existing in a vicinity closer to the drains of transistors k02 and k03 (i.e., BL2) and memory cells k02 and k03 are all subjected to a weak write.

As memory cells k02 and k03 have all been subjected to a weak write operation, memory cell transistors k02 and k03 have their threshold voltages all increasing. In FIG. 4, threshold voltages Vth102, Vth103, Vth202, Vth203 have all increased.

At time t4 word lines WL1–WLn are all set to recover an inactive state of 0V.

At time t5 select gate lines SG1, SG2, SG3 are set to recover an inactive state of 0V.

At time t6 main bit line MBL is set to recover an inactive state of 0V and a weak write operation for all of memory cells k02 and k03 is once terminated. Memory cells k02 and k03 currently have their threshold voltages all having increased to approximately 1.5 to 1.7V. The increase in threshold voltage resulting from the weak write operation is verified from times t7 through t12.

At time t7 a verify voltage 3V is applied to main bit line MBL1. Note that main bit line MBL2 continues to have 0V.

At time t8 a voltage of 9V is applied to select gate lines SG1, SG3. Thus via select gates 10, 30 main bit lines MBL1, MBL2 and bit lines BL1, BL2 are connected together, respectively. As a result, bit lines BL1 and BL2 transition to 3V and 0V, respectively. Note that bit lines BL3, BL4 both continue to have a high impedance state (Hi-Z).

At time t9 a voltage of approximately 2V is applied to word line WL1 and a verify operation for any one memory cell, memory cell 102 in this example, is started. Rather than all of memory cells k02 and k03 having been written and erased, any one memory cell alone is subjected to a verify operation. This is one of feature of the present invention. The verify operation is only required to be performed for any single memory cell, for a reason described later:

The verify operation is performed by applying a voltage of approximately 2V to word line WL1 and detecting weather memory cell 102 passes a current. If memory cell

102 passes a current a decision can be made that the cell's threshold voltage is still in an overerased condition and if not then a decision can be made that the cell's threshold voltage is already in an erased condition.

At time t10 word line WL1 is set to recover an inactive state of 0V.

At time t11 select gate lines SG1, SG3 is set to recover an inactive state of 0V.

At time t12 main bit line MBL1 is set to recover an inactive state of 0V and a verify operation for memory cell 102 is once terminated. Currently, memory cell 102 has its threshold voltage Vth102 still below 2V corresponding to an erased condition, as shown in FIG. 5. Accordingly from times t13 through time t24 a similar weak write and verification is again effected.

The series of weak write and verify operations is repeated until threshold voltage Vth102 attains 2V corresponding to the erased condition.

Figure 6:
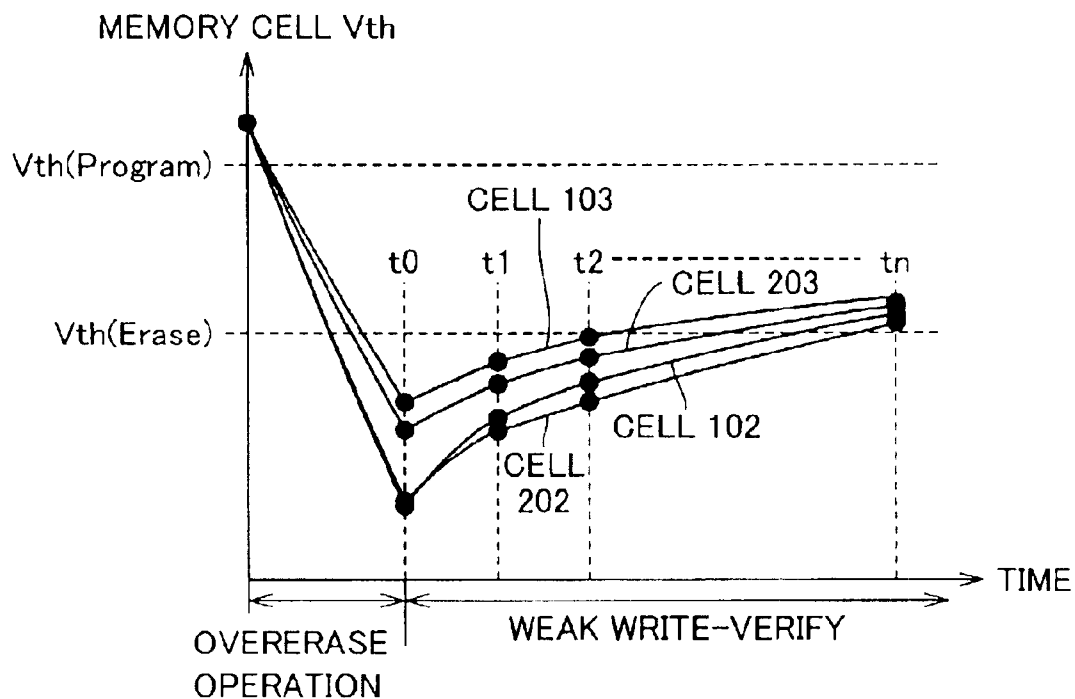
FIG. 6 is a graph representing a variation with time of a threshold voltage Vth of each memory cell resulting from an overerase operation and a weak write and verify operation performed for cells 102, 103, 202, 203.

FIG. 6 is a graph representing a variation with time of a threshold voltage Vth of each memory cell resulting from an overerase operation and a weak write and verify operation effected for cells 102, 103, 202, 203.

FIG. 6 represents a variation of threshold voltage Vth of each memory cell that is observed when prior to time t0 all cells are subjected to an overerase operation and from times t0 through t1 a first weak write and verify operation is performed and from times t1 through time t2 a second weak write and verify operation is performed and for subsequent similar time periods subsequent weak write and verify operations are performed.

As also shown in FIG. 6, there is a high possibility that before verified cell 102 exceeds a threshold voltage corresponding to an erased condition (2V in FIG. 5) many of the other memory cells also do not exceed the threshold voltage corresponding to the erased condition. In contrast, it is highly possible that if verified cell 102 exceeds the threshold voltage corresponding to the erased condition then many of the other cells also exceed the threshold voltage corresponding to the erased condition.

If this feature is noted, then by monitoring the threshold voltage of any verified single cell the conditions of the threshold voltages of many of the other cells can be estimated. The condition of the threshold voltage of any single cell substantially matches those of the threshold voltages of many of the other cells for a reason, as will be described hereinafter with reference to FIG. 7.

Figure 7:
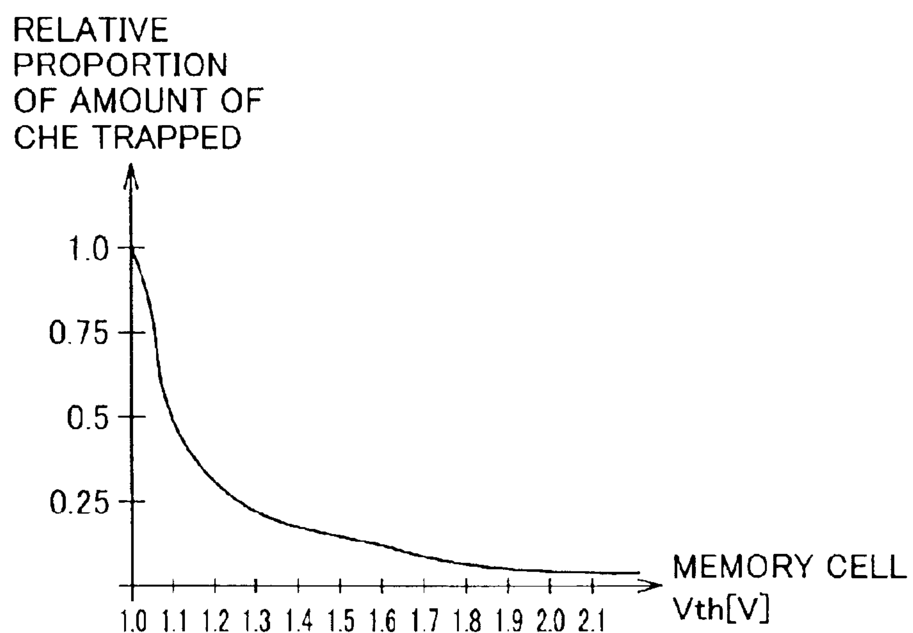
FIG. 7 is a graph representing a relative proportion of an amount of CHE trapped versus a variation of threshold voltage Vth of a memory cell.

FIG. 7 is a graph of a relative proportion of an amount of trapped CHE relative to a variation of threshold voltage Vth of a memory cell.

As shown in FIG. 7, when threshold voltage Vth is low a large proportion of CHE is trapped by an ONO film within a period of time and when threshold voltage Vth is high such proportion significantly decreases. This feature is described as follows:

In a weakly written condition a word line's voltage is lower than in a normally written condition. In contrast, when threshold voltage Vth is high, i.e., when electrons are trapped in an ONO film to some extent, an electric field having a magnitude corresponding thereto is generated. As such, even if a CHE having a negative electric charge is generated, an effect of the above electric field that acts in a direction preventing the CHE from being trapped in the ONO film is relatively increased and a reduced proportion of CHE is trapped by the ONO film within the period of time.

In contrast, when threshold voltage Vth is low, the effect of the above electric field that acts in a direction preventing a generated CHE from being trapped in the ONO film decreases and an increased proportion of CHE is trapped by the ONO film within the period of time.

Accordingly, as shown in FIG. 6, when at time t0 cells are overerased all at once and at times t1, t2, . . . , tn, corresponding to boundaries a weak write and verify operation is repeated, a cell with relatively low threshold voltage Vth has Vth rapidly increasing and a cell with a relatively high threshold voltage Vth has Vth slowly increasing. As such, even if a cell having exceeded a threshold voltage corresponding to an erased condition is subsequently, continuously subjected to a weak write, its threshold voltage only increases slightly.

As such, that any single cell exceeds a threshold voltage corresponding to an erased condition indicates that many of the other cells have also reached the threshold voltage corresponding to the erased condition. As such, by subjecting any single cell to a verify operation, the conditions of the threshold voltages of many of the other cells can be estimated. If this feature is utilized, a verify operation including a weak write operation conventionally performed for each single bit can be effected for a plurality of cells at one time. The verify operation can be performed in a reduced period of time.

Thus in the first embodiment the weak write using CHE and the reduction of the proportion of electrons trapped in an ONO film as a threshold value increases can be utilized to correct a variation in threshold value between memory cell transistors in a simultaneous write operation following overerasure and also allow a verify operation to be performed in a reduced period of time.

Furthermore, memory cells are all simultaneously subjected to an erase operation and a weak write operation. The operations can be finished in a reduced period of time.

Second Embodiment

In the first embodiment such operations as writing to, erasing and verifying cells arranged on opposite sides of a singled line have been described. These operations can be extended to operations such as writing to, erasing and verifying cells arranged on opposite sides of every other bit line.

Figure 8:
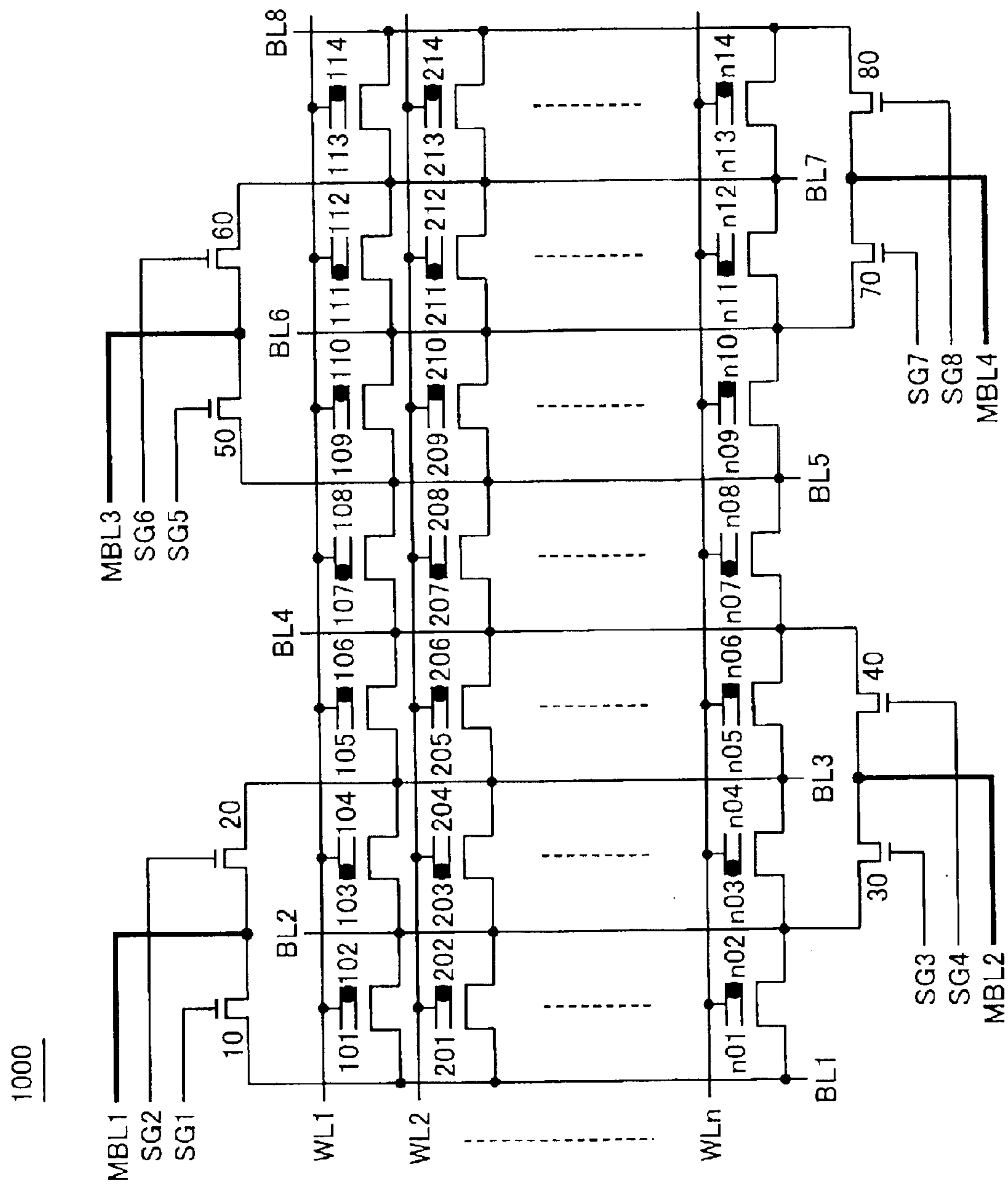
FIGS. 8 and 9 are each a circuit diagram showing a circuit configuration of memory cell array 1000 of the present invention in a second embodiment.

FIG. 8 is a circuit diagram showing a circuit configuration of memory cell array 1000 of the present invention in a second embodiment.

As shown in FIG. 8, the second embodiment provides memory cell array 1000 generally configured of two memory cell arrays 1000 of the first embodiment that are linked together. In the FIG. 8 memory cell array 1000, memory cells sandwiching even address numbered bit lines BL2, BL4, BL6, BL8 are subjected to such operations as write, erase and verify, which is represented in memory cells by dots.

Memory cell array 1000 of the second embodiment shown in FIG. 8 has a circuit configuration, as will be more specifically described hereinafter.

As shown in FIG. 8, memory cell array 1000 of the second embodiment includes memory cells k01–k14 connected to word line WLk, and select gates 10–80 connecting/disconnecting a main bit line and a bit line in accordance with a voltage applied to select gate lines SG1–SG8, wherein k=1 to n.

Memory cell k01 is connected to bit line BL1. Memory cells k02, k03 are connected to and share bit line BL2. Memory cells k04, k05 are both connected to and share bit line BL3. Memory cells k06, k07 are both connected to and share bit line BL4.

Memory cells k08, k09 are both connected to and share bit line BL5. Memory cells k10, k11 are both connected to and share bit line BL6. Memory cells k12, k13 are both connected to and share a bit line BL7. Memory cell k14 is connected to bit line BL8.

Select gate 10 connects/disconnects main bit line MBL1 and bit line BL1 in accordance with a voltage applied to select gate line SG1. Select gate 20 connects/disconnects main bit line MBL1 and bit line BL3 in accordance with a voltage applied to select gate line SG2. Select gate 30 connects/disconnects main bit line MBL2 and bit line BL2 in accordance with a voltage applied to select gate line SG3. Select gate 40 connect/disconnects main bit line MBL2 and bit line BL4 in accordance with a voltage applied to select gate line SG4.

Select gate 50 connects/disconnects main bit line MBL3 and bit line BL5 in accordance to a voltage applied to select gate line SG5. Select gate 60 connects/disconnects main bit line MBL3 and bit line BL7 in accordance with a voltage applied to select gate line SG6. Select gate 70 connects/disconnects main bit line MBL4 and bit line BL6 in accordance with a voltage applied to select gate line SG7. Select gate 80 connects/disconnects main bit line MBL4 and bit line BL8 in accordance with a voltage applied to select gate line SG8.

The write, erase and verify operations are only required to be effected such that, with reference to FIGS. 3–5 described in the first embodiment, the operations of main bit lines MBL3, MBL4 are identical to those of main bit lines MBL1, MBL2 and the operations of select gate lines SG5–SG8 are identical to those of select gate lines SG1–SG4.

It should be note, however, that as well as in the first embodiment, the verify operation is only required to be effected for any single memory cell and accordingly in the verify operation represented in FIG. 5 from times t7 though t12 and times t19 through t24 the operations of select gate lines SG5–SG8 are not required to be identical to those of select gate lines SG1–SG4.

Figure 9:
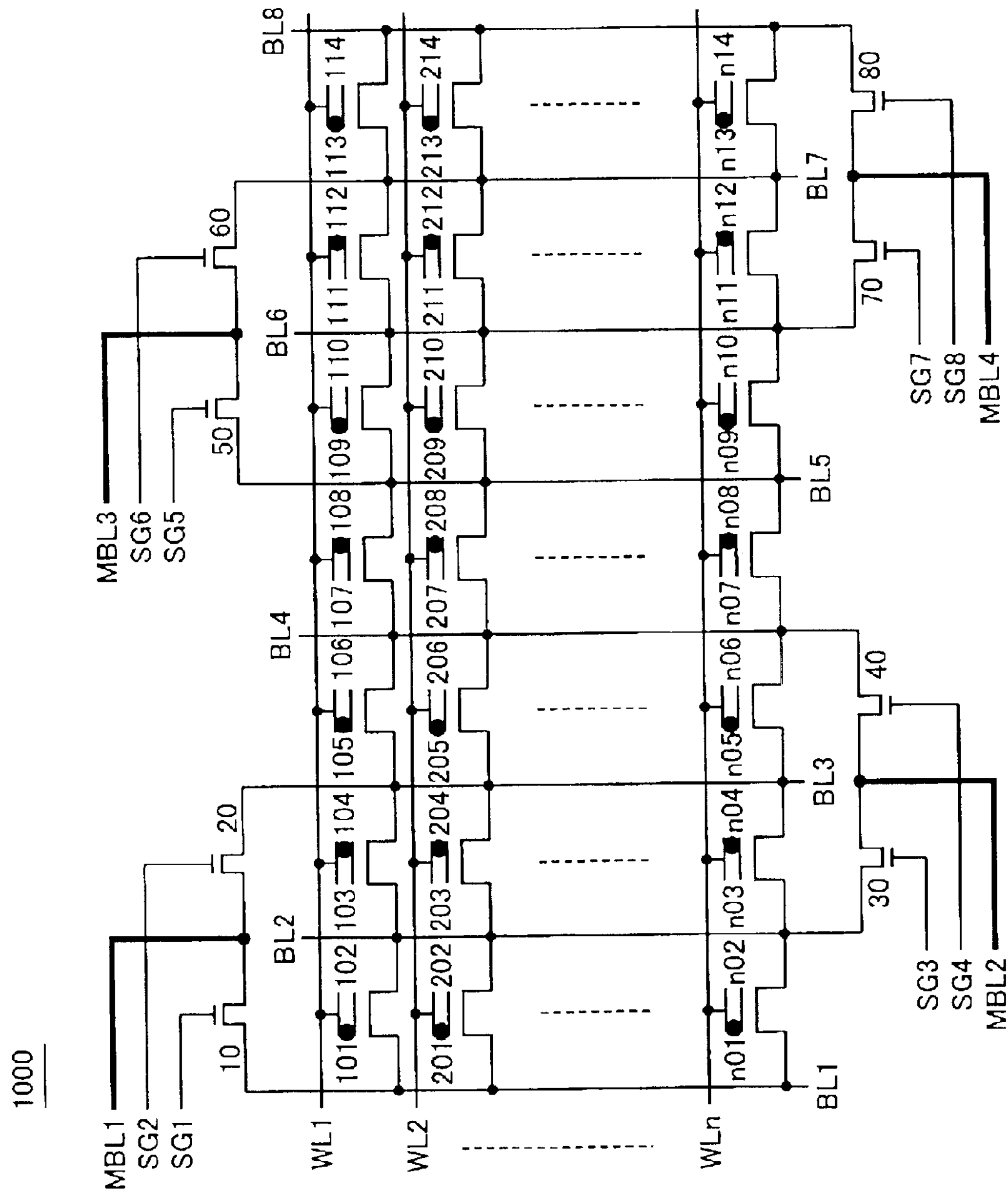

FIG. 9 is a circuit diagram showing a circuit configuration of memory cell array 1000 of the present invention in the second embodiment.

The circuit configuration of memory cell array 1000 of the second embodiment shown in FIG. 9 is identical to that of memory cell array 1000 shown in FIG. 8 and its description will not be repeated. In the FIG. 9 memory cell array 1000, memory cells sandwiching odd address numbered bit lines BL1, BL3, BL5, BL7 are subjected to write, erase and verify and other similar operations, which is represented in memory cells by dots.

With reference to FIGS. 3–5 described in the first embodiment, in performing the write, erase and verify, operations the operation of main bit line MBL1 and that of main bit line MBL2 are interchanged in memory cell array 1000 of the second embodiment. Then, similarly as described in FIG. 8, the operations of main bit lines MBL3, MBL4 are provided to be identical to those of main bit lines MBL1, MBL2 and the operations of select gate lines SG5–SG8 are provided to be identical to those of select gate lines SG1–SG4.

It should be noted, however, that as has been described in FIG. 8, the verify operation is only required to be performed for any single memory cell and accordingly in the verify operation represented in FIG. 5 from times t7 through t12 and times t19 through t24 the operations of select gate lines SG5–SG8 are not required to be identical to those of select gate lines SG1–SG4.

By successively providing the operation described in FIG. 8 and that described in FIG. 9, memory cells connected to even address numbered bit lines and those connected to odd address numbered bit lines can be successively, collectively subjected to write, erase and verify (including weak write) operations. In other words, each of the write, erase and verify operations for the entire memory cell array can be finished in the two operations described with reference to FIGS. 8 and 9. As such, each operation can be performed in a significantly reduced period of time.

Thus in the second embodiment the write, erase and verify operations for cells sandwiching a signal bit line, as described in the first embodiment, can be extended to write, erase and verify operations for cells sandwiching every other one of a plurality of bit lines to perform each of the write, erase and verify operations in a significantly reduced period of time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:

first, second and third bit lines arranged to extend in a direction of a column;

a plurality of memory cells configuring first and second memory cell columns adjacent to each other, each memory cell being configured of a transistor having an electric charge trapping film;

a plurality of word lines provided to correspond respectively to rows of said plurality of memory cells, said first memory cell column being connected between said first bit line and said second bit line, said second memory cell column being connected between said second bit line and said third bit line;

an erase control portion controlling an erase operation effected for said plurality of memory cells; and a weak write control portion controlling a weak write operation effected for said plurality of memory cells, said erase control portion subjecting all of said plurality of memory cells simultaneously to an erase operation allowing a memory cell to transition to an overerased condition, said weak write control portion subjecting all of said plurality of memory cells simultaneously to a weak write operation using a channel hot electron.

2. The non-volatile semiconductor memory device according to claim 1, wherein said weak write control portion performs said weak write operation by applying a voltage larger than a read voltage and smaller than a write voltage.

3. The non-volatile semiconductor memory device according to claim 1, wherein said weak write control portion performs said weak write operation by controlling a write time.

4. The non-volatile semiconductor memory device according to claim 1, further comprising a verify control portion controlling a verify operation effected for said plurality of memory cells, said verify control portion subjecting any single selected one of said plurality of memory cells to a verify operation confirming whether said weak write operation has increased threshold voltages respectively of said plurality of memory cells, as based on a reduced proportion of electrons trapped in an oxide nitride oxide film as a threshold value increases.

5. The semiconductor memory device according to claim 4, wherein said weak write control portion and said verify control portion repeat said weak write operation and said verify operation, respectively, until said selected one of said plurality of memory cells having been shifted by said erase control portion to an overerased condition attains an erased condition.

* * * * *